US010503321B2

(12) United States Patent
Wu et al.

(10) Patent No.: US 10,503,321 B2
(45) Date of Patent: Dec. 10, 2019

(54) OPTICAL SENSING UNIT, TOUCH PANEL, METHOD FOR MANUFACTURING OPTICAL SENSING UNIT, METHOD FOR MANUFACTURING TOUCH PANEL, AND DISPLAY DEVICE

(71) Applicant: BOE TECHNOLOGY GROUP CO., LTD., Beijing (CN)

(72) Inventors: Chunwei Wu, Beijing (CN); Chungchun Lee, Beijing (CN); Yanfeng Wang, Beijing (CN); Xiaoguang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/802,703

(22) Filed: Jul. 17, 2015

(65) Prior Publication Data
US 2016/0282975 A1     Sep. 29, 2016

(30) Foreign Application Priority Data

Mar. 23, 2015   (CN) .......................... 2015 1 0128580

(51) Int. Cl.
*H01L 29/786* (2006.01)
*H01L 29/66* (2006.01)
(Continued)

(52) U.S. Cl.
CPC ............ *G06F 3/042* (2013.01); *G06F 3/0412* (2013.01); *H01L 27/1225* (2013.01);
(Continued)

(58) Field of Classification Search
None
See application file for complete search history.

(56) References Cited

U.S. PATENT DOCUMENTS 4,775,549 A * 10/1988 Ota ......................... C23C 14/56
216/4
5,414,283 A * 5/1995 den Boer .............. G02F 1/1368
257/59
(Continued)

FOREIGN PATENT DOCUMENTS

CN         101907807 A     12/2010

OTHER PUBLICATIONS

First Office Action regarding Chinese application No. 201510128580. 7, dated Mar. 9, 2017. Translation provided by Dragon Intellectual Property Law Firm.

*Primary Examiner* — Bo B Jang
(74) *Attorney, Agent, or Firm* — Harness, Dickey & Pierce, P.L.C.

(57) ABSTRACT

The present disclosure provides an optical sensing unit, a touch panel, a method for manufacturing the optical sensing unit, a method for manufacturing the touch panel, and a display device. The optical sensing unit includes a Photo thin film transistor (TFT), a storage capacitor for storing a leakage current generated by the Photo TFT, and a Readout TFT for reading out an electric signal stored in the storage capacitor. The method for manufacturing the optical sensing unit includes a step of forming a gate electrode of the Readout TFT capable of shielding an active layer of the Readout TFT and preventing the active layer from being exposed to an ambient light beam.

6 Claims, 2 Drawing Sheets

(51) Int. Cl.
*H01L 29/49* (2006.01)
*H01L 27/12* (2006.01)
*H01L 27/144* (2006.01)
*G06F 3/042* (2006.01)
*G06F 3/041* (2006.01)

(52) U.S. Cl.
CPC ...... *H01L 27/1251* (2013.01); *H01L 27/1255* (2013.01); *H01L 29/4908* (2013.01); *H01L 29/66969* (2013.01); *H01L 29/78633* (2013.01); *H01L 29/78693* (2013.01); *G06F 2203/04103* (2013.01); *H01L 27/1443* (2013.01)

(56) References Cited

U.S. PATENT DOCUMENTS

2008/0074401 A1\* 3/2008 Chung .................. G02F 1/1368
345/175
2012/0138929 A1\* 6/2012 Jung ................. H01L 29/42384
257/55

\* cited by examiner

OPTICAL SENSING UNIT, TOUCH PANEL, METHOD FOR MANUFACTURING OPTICAL SENSING UNIT, METHOD FOR MANUFACTURING TOUCH PANEL, AND DISPLAY DEVICE

CROSS-REFERENCE TO RELATED APPLICATION

The present application claims a priority of the Chinese patent application No. 201510128580.7 filed on Mar. 23, 2015, which is incorporated herein by reference in its entirety.

TECHNICAL FIELD

The present disclosure relates to the field of touch technology, in particular to an optical sensing unit, a touch panel, a method for manufacturing the optical sensing unit, a method for manufacturing the touch panel, and a display device.

BACKGROUND

An optical sensing unit is mainly adopted by an existing touch panel to determine a touch position. Generally, a mainstream optical sensing unit includes two thin film transistors (TFTs), i.e., a Photo TFT and a Readout TFT, and one storage capacitor. When the optical sensing unit is exposed to a light beam, a leakage current is always generated by the Photo TFT and stored in the storage capacitor. In each Photo period, the Readout TFT is turned on once, so as to read out an electric signal stored in the storage capacitor. A state of the Photo TFT may be determined in accordance with the electric signal read out by the Readout TFT, so as to determine the touch position.

The Photo TFT is required to receive an ambient light beam, so it must be exposed to the ambient light beam. However, the Readout TFT cannot be exposed to the ambient light beam, otherwise an undesired photoelectric current will be generated by the Readout TFT, and thereby the electric signal read out by the Readout TFT will be adversely affected. Hence, for the touch panel, it is required to provide a black matrix to shield an active layer of the Readout TFT, so as to prevent the active layer of the Readout TFT from being exposed to the ambient light beam. When the optical sensing unit is integrated into a display panel, a black matrix of the display panel itself may be used to shield the active layer of the Readout TFT. However, when the optical sensing unit is not integrated into the display panel, it is required to provide an additional black matrix to shield the active layer thereof, which thus results in a complex process and an increase in the production cost.

SUMMARY

An object of the present disclosure is to provide an optical sensing unit, a touch panel, a method for manufacturing the optical sensing unit, a method for manufacturing the touch panel, and a display device, so as to shield an active layer of a Readout TFT with a gate electrode of the Readout TFT rather than an additional black matrix.

In one aspect, the present disclosure provides in an embodiment a method for manufacturing an optical sensing unit. The optical sensing unit includes a Photo TFT, a storage capacitor for storing a leakage current generated by the Photo TFT, and a Readout TFT for reading out an electric signal stored in the storage capacitor. The method includes a step of forming a gate electrode of the Readout TFT capable of shielding an active layer of the Readout TFT and preventing the active layer from being exposed to an ambient light beam.

Further, the step of forming the gate electrode includes forming a source electrode and a drain electrode of the Photo TFT and the gate electrode of the Readout TFT by a single patterning process.

Further, the method for manufacturing the optical sensing unit includes:

forming an active layer of the Photo TFT and the active layer of the Readout TFT by a single patterning process; and/or forming a gate electrode of the Photo TFT and a source electrode and a drain electrode of the Readout TFT by a single patterning process.

In another aspect, the present disclosure provides in an embodiment an optical sensing unit manufactured by the above-mentioned method. A gate electrode of a Readout TFT is capable of shielding an active layer of the Readout TFT and preventing the active layer from being exposed to an ambient light beam.

In yet another aspect, the present disclosure further provides in an embodiment a method for manufacturing a touch panel, including a step of forming an optical sensing unit on a base substrate using the above-mentioned method.

Further, the method for manufacturing the touch panel includes a step of forming a pixel TFT on the base substrate.

Further, the method for manufacturing the touch panel includes forming a source electrode and a drain electrode of a Photo TFT, a source electrode and a drain electrode of the pixel TFT, and the gate electrode of the Readout TFT.

Further, the method for manufacturing the touch panel includes:

forming an active layer of the Photo TFT, an active layer of the pixel TFT and an active layer of the Readout TFT; and/or forming a gate electrode of the Photo TFT, a gate electrode of the pixel TFT, and a source electrode and a drain electrode of the Readout TFT.

In still yet another aspect, the present disclosure provides in an embodiment a touch panel manufactured by the above-mentioned method.

In still yet another aspect, the present disclosure provides in an embodiment a display device including the above-mentioned touch panel.

According to the embodiments of the present disclosure, the optical sensing unit includes the Photo TFT, the storage capacitor storing the leakage current generated by the Photo TFT, and the Readout TFT reading out the electric signal stored in the storage capacitor. The gate electrode of the Readout TFT is capable of shielding the active layer of the Readout TFT and preventing the active layer from being exposed to the ambient light beam. As a result, it is able to shield the active layer of the Readout TFT merely by the gate electrode of the Readout TFT itself rather than any additional black matrix.

DETAILED DESCRIPTION

Figure 1:
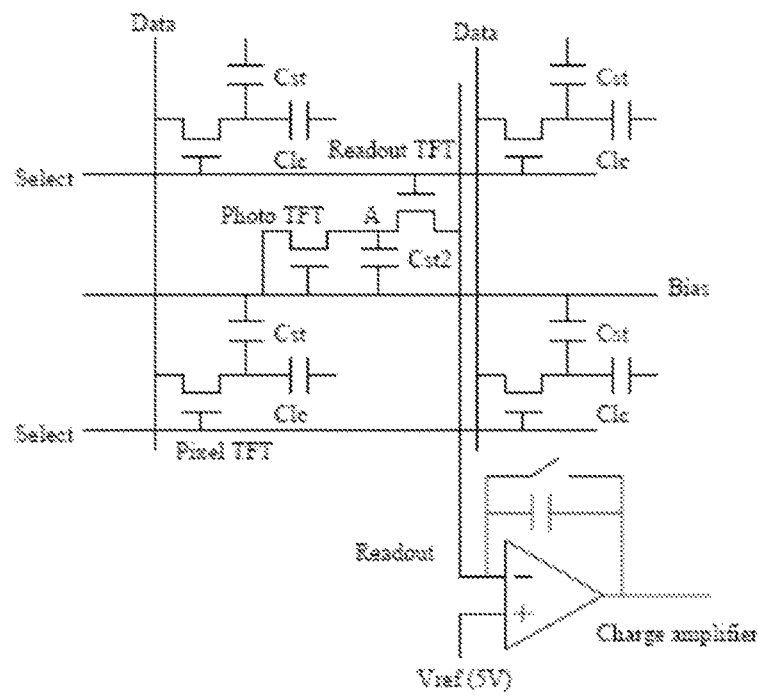
FIG. 1 is a circuit diagram of a touch panel according to an embodiment of the present disclosure.

In order to make the objects, the technical solutions and the advantages of the present disclosure more apparent, the present disclosure will be described hereinafter in conjunction with the drawings and embodiments.

An object of the present disclosure is to provide an optical sensing unit, a touch panel, a method for manufacturing the optical sensing unit, a method for manufacturing the touch panel, and a display device, so as to shield an active layer of a Readout TFT with a gate electrode of the Readout TFT rather than an additional black matrix.

First Embodiment

The present disclosure provides in this embodiment a method for manufacturing an optical sensing unit. The optical sensing unit includes a Photo TFT, a storage capacitor for storing a leakage current generated by the Photo TFT, and a Readout TFT for reading out an electric signal stored in the storage capacitor. The method includes a step of: forming a gate electrode of the Readout TFT capable of shielding an active layer of the Readout TFT and preventing the active layer from being exposed to an ambient light beam.

According to this embodiment, the optical sensing unit includes the Photo TFT, the storage capacitor storing the leakage current generated by the Photo TFT, and the Readout TFT reading out the electric signal stored in the storage capacitor. The gate electrode of the Readout TFT is capable of shielding the active layer of the Readout TFT and preventing the active layer from being exposed to the ambient light beam. As a result, it is able to shield the active layer of the Readout TFT merely by the gate electrode of the Readout TFT itself rather than any additional black matrix.

Further, in order to reduce the number of patterning processes, the step of forming the gate electrode includes forming a source electrode and a drain electrode of the Photo TFT and the gate electrode of the Readout TFT by a single patterning process.

Further, in order to reduce the number of patterning processes, the method for manufacturing the optical sensing unit includes: forming an active layer of the Photo TFT and the active layer of the Readout TFT by a single patterning process; and/or forming a gate electrode of the Photo TFT and a source electrode and a drain electrode of the Readout TFT by a single patterning process.

Second Embodiment

The present disclosure provides in this embodiment an optical sensing unit manufactured by the above-mentioned method. A gate electrode of a Readout TFT is capable of shielding an active layer of the Readout TFT and preventing the active layer from being exposed to an ambient light beam.

According to this embodiment, the optical sensing unit includes the Photo TFT, the storage capacitor storing the leakage current generated by the Photo TFT, and the Readout TFT reading out the electric signal stored in the storage capacitor. The gate electrode of the Readout TFT is capable of shielding the active layer of the Readout TFT and preventing the active layer from being exposed to the ambient light beam. As a result, it is able to shield the active layer of the Readout TFT merely by the gate electrode of the Readout TFT itself rather than any additional black matrix.

Third Embodiment

The present disclosure provides in this embodiment a method for manufacturing a touch panel, which includes a step of forming the optical sensing unit on a base substrate using the above-mentioned method.

According to the method for manufacturing the touch panel in this embodiment, the gate electrode of the Readout TFT is capable of shielding the active layer of the Readout TFT and preventing the active layer from being exposed to the ambient light beam. As a result, it is able to shield the active layer of the Readout TFT merely by the gate electrode of the Readout TFT itself rather than any additional black matrix.

Further, the method for manufacturing the touch panel includes a step of forming a pixel TFT on the base substrate.

Further, in order to reduce the number of patterning processes, the method for manufacturing the touch panel includes forming a source electrode and a drain electrode of a Photo TFT, a source electrode and a drain electrode of the pixel TFT, and the gate electrode of the Readout TFT.

Further, in order to reduce the number of patterning process, the method for manufacturing the touch panel includes:
forming an active layer of the Photo TFT, an active layer of the pixel TFT and an active layer of the Readout TFT; and/or
forming a gate electrode of the Photo TFT, a gate electrode of the pixel TFT, and a source electrode and a drain electrode of the Readout TFT.

Fourth Embodiment

The present disclosure provides in this embodiment the touch panel manufactured by the above-mentioned method.

According to the touch panel in this embodiment, the gate electrode of the Readout TFT is capable of shielding the active layer of the Readout TFT and preventing the active layer from being exposed to the ambient light beam. As a result, it is able to shield the active layer of the Readout TFT merely by the gate electrode of the Readout TFT itself rather than any additional black matrix Fifth Embodiment The present disclosure provides in this embodiment a display device including the above-mentioned touch panel. The display device may be any product or member having a display function, such as a liquid crystal panel, a liquid crystal TV, a liquid crystal display, a digital photo frame, a mobile phone, a flat-panel PC, a navigator or an electronic paper.

Sixth Embodiment

Figure 2:
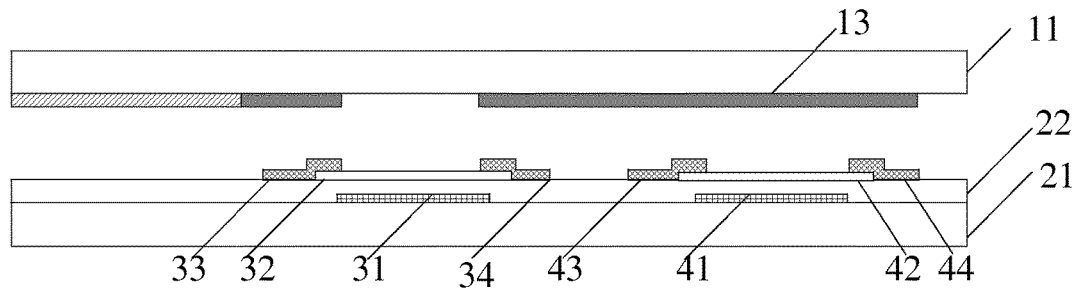
FIG. 2 is a sectional view of an existing optical sensing unit.

Generally, an existing optical sensing unit includes two TFTs, i.e., a Photo TFT and a Readout TFT, and one storage capacitor. As shown in FIG. 2, which is a sectional view of the existing optical sensing unit, a gate electrode 31 of the Photo TFT, a gate electrode 41 of the Readout TFT, a gate insulating layer 22, an active layer 32 of the Photo TFT, an active layer 42 of the Readout TFT, a source electrode 33 and a drain electrode 34 of the Photo TFT, and a source electrode 43 and a drain electrode 44 of the Readout TFT are sequentially formed on a base substrate 21. When the optical sensing unit is exposed to a light beam, a leakage current is always generated by the Photo TFT and stored in the storage capacitor. In each Photo period, the Readout TFT is turned on once, so as to read out an electric signal stored in the storage capacitor. A state of the Photo TFT may be determined in accordance with the electric signal read out by the Readout TFT, so as to determine the touch position.

The Photo TFT is required to receive an ambient light beam, so it must be exposed to the ambient light beam. However, the Readout TFT cannot be exposed to the ambient light beam, otherwise an undesired photoelectric current will be generated by the Readout TFT, and thereby the electric signal read out by the Readout TFT will be adversely affected. Hence, for the touch panel, it is required to provide a black matrix to shield an active layer of the Readout TFT, so as to prevent the active layer of the Readout TFT from being exposed to the ambient light beam. As shown in FIG. 2, when the optical sensing unit is integrated into a display panel, a black matrix 13 on a base substrate 11 opposite to the base substrate 21 may be used to shield the active layer of the Readout TFT. However, when the optical sensing unit is not integrated into the display panel, it is required to provide an additional black matrix to shield the active layer thereof, which thus results in a complex process and an increase in the production cost.

Figure 3:
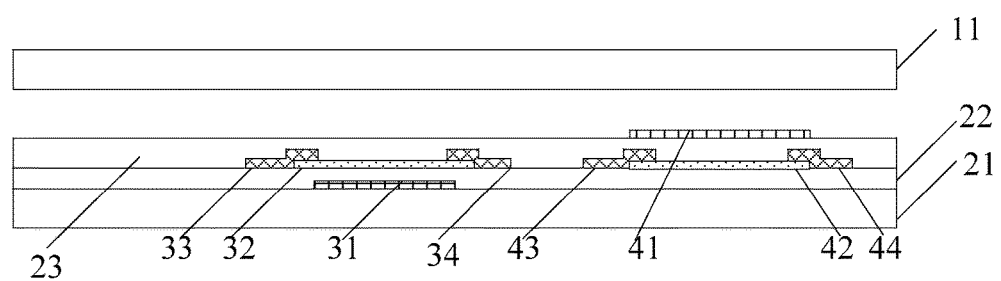
FIG. 3 is a sectional view of the optical sensing unit according to one embodiment of the present disclosure.

In order to overcome the above defects, the present disclosure provides in this embodiment an optical sensing unit. As shown in FIG. 3, the gate electrode 41 of the Readout TFT of the optical sensing unit is capable of shielding the active layer 42 of the Readout TFT and preventing the active layer 42 from being exposed to the ambient light beam. The optical sensing unit in this embodiment may be applied to a touch panel, so as to not only perform fingerprint recognition by detecting a position of the touch made by a finger, but also to serve as an ambient light beam detector for detecting the ambient light beam. To be specific, the optical sensing unit in this embodiment may be manufactured by the following steps.

Step a1: providing the base substrate 21, and forming patterns of the gate electrode 31 of the Photo TFT and gate lines on the base substrate 21.

The base substrate 21 may be a glass substrate or a quartz substrate. To be specific, a gate metal layer having a thickness of 2500 to 16000 Å may be deposited onto the base substrate 21 by sputtering or thermal evaporation. The gate metal layer may be made of Cu, Al, Ag, Mo, Cr, Nd, Ni, Mn, Ti, Ta or W, or an alloy thereof, and it may be of a single-layered structure, or multiple-layered structure such as Cu/Mo, Ti/Cu/Ti and Mo/Al/Mo. A photoresist layer may be applied onto the gate metal layer, and then exposed with a mask plate, so as to form a photoresist reserved region corresponding to a region where the patterns of the gate lines and the gate electrode 31 of the Photo TFT are located, and a photoresist unreserved region corresponding to the other regions. Next, the photoresist layer is developed, so as to fully remove the photoresist at the photoresist unreserved region, and enable a thickness of the photoresist at the photoresist reserved region to remain unchanged. Then, the gate metal layer at the photoresist unreserved region is fully etched off by an etching process, and the remaining photoresist is removed, so as to form the patterns of the gate lines and the gate electrode 31 of the Photo TFT.

Step a2: forming the gate insulating layer 22, and patterns of the active layer 32 of the Photo TFT and the active layer 42 of the Readout TFT on the base substrate 21.

To be specific, the gate insulating layer 22 having a thickness of about 2000 to 6000 Å may be deposited onto the base substrate 21 by plasma enhanced chemical vapor deposition (PECVD). The gate insulating layer may be made of an oxide, a nitride or an oxynitride, and it may be of a single-layered, double-layered or multiple-layered structure. Specifically, the gate insulating layer may be made of SiNx, SiOx or Si(ON)x.

A semiconductor layer having a thickness of about 20 to 1000 Å may be deposited onto the gate insulating layer 22 by magnetron-sputtering, thermal evaporation or any other film-forming method. Then, a photoresist is applied onto the semiconductor layer, and then exposed and developed. Next, the semiconductor layer is etched, and the photoresist is removed, so as to form the patterns of the active layer 32 of the Photo TFT and the active layer 42 of the Readout TFT.

Step a3: forming patterns of the source electrode 33 and the drain electrode 34 of the Photo TFT as well as the source electrode 43 and the drain electrode 44 of the Readout TFT on the base substrate 21.

To be specific, a source/drain metal layer having a thickness of about 2000 to 6000 Å may be deposited onto the base substrate 21 by magnetron-sputtering, thermal evaporation of any other film-forming methods. The source/drain metal layer may be made of Cu, Al, Ag, Mo, Cr, Nd, Ni, Mn, Ti, Ta or W, or an alloy thereof, and it may be of a single-layered structure, or a multiple-layered structure such as Cu/Mo, Ti/Cu/Ti or Mo/Al/Mo. A photoresist layer may be applied onto the source/drain metal layer, and exposed with a mask plate, so as to form a photoresist reserved region corresponding to a region where the patterns of the source electrode 33 and the drain electrode 34 of the Photo TFT and the source electrode 43 and the drain electrode 44 of the Readout TFT are located, and a photoresist unreserved region corresponding to the other regions. Next, the photoresist layer is developed, so as to fully remove the photoresist at the photoresist unreserved region and enable a thickness of the photoresist at the photoresist reserved region to remain unchanged. Then, the source/drain metal layer at the photoresist unreserved region is fully etched off by an etching process and the remaining photoresist is removed, so as to form the patterns of the source electrode 33 and the drain electrode 34 of the Photo TFT and the source electrode 43 and the drain electrode 44 of the Readout TFT.

Step a4: forming an insulating layer 23 and a pattern of the gate electrode 41 of the Readout TFT on the base substrate 21.

To be specific, the insulating layer 23 having a thickness of about 2000 to 6000 Å may be deposited onto the base substrate 21 by PECVD. The insulating layer may be made of an oxide, a nitride or an oxynitride, and it may be of a single-layered, double-layered or multiple-layered structure. Specifically, the insulating layer may be made of SiNx, SiOx or Si(ON)x.

A gate metal layer having a thickness of 2500 to 16000 Å may be deposited onto the insulating layer 23 by sputtering or thermal evaporation. The gate metal layer may be made of Cu, Al, Ag, Mo, Cr, Nd, Ni, Mn, Ti, Ta or W, or an alloy thereof, and it may be of a single-layered structure, or a multiple-layered structure such as Cu/Mo, Ti/Cu/Ti or Mo/Al/Mo. A photoresist layer may be applied onto the gate metal layer and then exposed with a mask plate, so as to form a photoresist reserved region corresponding to a region where the pattern of the gate electrode 41 of the Readout TFT is located, and a photoresist unreserved region corresponding to the other regions. Then, the photoresist layer is developed, so as to fully remove the photoresist at the photoresist unreserved region and enable a thickness of the photoresist at the photoresist reserved region to remain unchanged. Next, the gate metal layer at the photoresist unreserved region is fully etched off by an etching process, and the remaining photoresist is removed, so as to form the pattern of the gate electrode 41 of the Readout TFT. The gate electrode 41 may be connected to the gate line through a via-hole, and it is capable of shielding the active layer 42 and preventing the active layer 42 from being exposed to the ambient light beam.

The optical sensing unit in FIG. 3 may be manufactured through the above-mentioned steps a1 to a4. In this embodiment, the gate electrode of the Readout TFT is capable of shielding the active layer of the Readout TFT and preventing the active layer from being exposed to the ambient light beam. As a result, it is able to shield the active layer of the Readout TFT merely by the gate electrode of the Readout TFT itself rather than any additional black matrix provided on the base substrate 11.

Seventh Embodiment

The optical sensing unit in the sixth embodiment may also be applied to an organic light-emitting diode (OLED) touch panel. Because a small-sized OLED display panel is usually not provided with a color filter substrate, it is required to provide an additional substrate with a black matrix to shield the active layer of the Readout TFT, which thus results in a complex process and an increase in the production cost. As shown in FIG. 1, the touch panel in this embodiment includes a pixel TFT apart from the Readout TFT and the Photo TFT. To be specific, the method for manufacturing the OLED display panel in this embodiment includes the following steps.

Step b1: providing the base substrate, and forming patterns of the gate electrode of the pixel TFT, the gate electrode of the Photo TFT and the gate lines on the base substrate.

The base substrate may be a glass substrate or a quartz substrate. To be specific, a gate metal layer having a thickness of 2500 to 16000 Å may be deposited onto the base substrate by sputtering or thermal evaporation. The gate metal layer may be made of Cu, Al, Ag, Mo, Cr, Nd, Ni, Mn, Ti, Ta or W, or an alloy thereof, and it may be of a single-layered structure, or multiple-layered structure such as Cu/Mo, Ti/Cu/Ti and Mo/Al/Mo. A photoresist layer may be applied onto the gate metal layer, and then exposed with a mask plate, so as to form a photoresist reserved region corresponding to a region where the patterns of the gate lines, the gate electrode of the pixel TFT and the gate electrode of the Photo TFT are located, and a photoresist unreserved region corresponding to the other regions. Next, the photoresist layer is developed, so as to fully remove the photoresist at the photoresist unreserved region, and enable a thickness of the photoresist at the photoresist reserved region to remain unchanged. Then, the gate metal layer at the photoresist unreserved region is fully etched off by an etching process, and the remaining photoresist is removed, so as to form the patterns of the gate lines, the gate electrode of the pixel TFT and the gate electrode of the Photo TFT.

Step b2: forming the gate insulating layer, the active layer of the pixel TFT, the active layer of the Photo TFT and the active layer of the Readout TFT on the base substrate.

To be specific, the gate insulating layer having a thickness of about 2000 to 6000 Å may be deposited onto the base substrate by PECVD. The gate insulating layer may be made of an oxide, a nitride or an oxynitride, and it may be of a single-layered, double-layered or multiple-layered structure. Specifically, the gate insulating layer may be made of SiNx, SiOx or Si(ON)x.

A semiconductor layer having a thickness of about 20 to 1000 Å may be deposited onto the gate insulating layer 22 by magnetron-sputtering, thermal evaporation or any other film-forming method. Then, a photoresist is applied onto the semiconductor layer, and then exposed and developed. Next, the semiconductor layer is etched, and the photoresist is removed, so as to form the patterns of the active layer of the pixel TFT, the active layer of the Photo TFT and the active layer of the Readout TFT.

Step b3: forming a pattern of an etch stop layer on the base substrate.

To be specific, the etch stop layer having a thickness of 400 to 5000 Å may be deposited onto the base substrate by magnetron-sputtering, thermal evaporation, PECVD or any other film-forming methods, and it may be made of an oxide, a nitride or an oxynitride. Specifically, the etch stop layer may be made of SiNx, SiOx or Si(ON)x, and it may be of a single-layered structure, or a double-layered structure consisting of SiNx and SiOx. More specifically, the etch stop layer may be a layer made of SiNx and having a thickness of 3000 Å.

A photoresist layer may be applied onto the etch stop layer, and then exposed with a mask plate, so as to form a photoresist reserved region corresponding a region where the pattern of the etch stop layer is located, and a photoresist unreserved region corresponding to the other regions. Next, the photoresist layer is developed, so as to fully remove the photoresist at the photoresist unreserved region and enable a thickness of the photoresist at the photoresist reserved region to remain unchanged. Then, the etch stop layer at the photoresist unreserved region is fully etched off by an etching process, and the remaining photoresist is removed, so as to form the pattern of the etch stop layer including a via-hole.

Step b4: forming patterns of the source electrode and drain electrode of the pixel TFT, the source electrode and drain electrode of the Readout TFT, the source electrode and the drain electrode of the Photo TFT, and data lines on the base substrate.

To be specific, a source/drain metal layer having a thickness of about 2000 to 6000 Å may be deposited onto the base substrate by magnetron-sputtering, thermal evaporation of any other film-forming methods. The source/drain metal layer may be made of Cu, Al, Ag, Mo, Cr, Nd, Ni, Mn, Ti, Ta or W, or an alloy thereof, and it may be of a single-layered structure, or a multiple-layered structure such as Cu/Mo, Ti/Cu/Ti or Mo/Al/Mo. Specifically, the source/drain metal layer may be a triple-layered structure consisting of a layer made of Ti and having a thickness of 500 Å, a layer made of Al and having a thickness of 2000 Å, and a layer made of Ti and having a thickness of 500 Å.

A photoresist layer may be applied onto the source/drain metal layer, and exposed with a mask plate, so as to form a photoresist reserved region corresponding to a region where the patterns of the source electrode and the drain electrode of the pixel TFT, the source electrode and the drain electrode of the Readout TFT, the source electrode and the drain electrode of the Photo TFT, and the data lines are located, and a photoresist unreserved region corresponding to the other regions. Next, the photoresist layer is developed, so as to fully remove the photoresist at the photoresist unreserved region and enable a thickness of the photoresist at the photoresist reserved region to remain unchanged. Then, the source/drain metal layer at the photoresist unreserved region is fully etched off by an etching process and the remaining photoresist is removed, so as to form the patterns of the source electrode and the drain electrode of the pixel TFT, the source electrode and the drain electrode of the Readout TFT, the source electrode and the drain electrode of the Photo TFT, and the data lines.

Step b5: forming a pattern of the passivation layer on the base substrate.

To be specific, the passivation layer having a thickness of 400 to 5000 Å may be deposited onto the base substrate by magnetron-sputtering, thermal evaporation, PECVD or any other film-forming methods. The passivation layer may be made of an oxide, a nitride or an oxynitride. Specifically, the passivation layer may be made of SiNx, SiOx or Si(ON)x, and it may be of a single-layered structure, or a double-layered structure consisting of layers made of SiNx and SiOx. More specifically, the passivation layer may be a layer made of SiNx and having a thickness of 3000 Å.

A photoresist layer may be applied onto the passivation layer and then exposed with a mask plate, so as to form a photoresist reserved region corresponding to a region where the pattern of the passivation layer is located, and a photoresist unreserved region corresponding to the other regions. Next, the photoresist layer is developed, so as to fully remove the photoresist at the photoresist unreserved region and enable a thickness of the photoresist at the photoresist reserved region to remain unchanged. Then, the passivation layer at the photoresist unreserved region is fully etched off by an etching method, and the remaining photoresist is removed, so as to form the pattern of the passivation layer including a via-hole.

Step b6: forming the gate electrode of the Readout TFT on the base substrate.

To be specific, a gate metal layer having a thickness of 2500 to 16000 Å may be deposited onto the passivation layer by sputtering or thermal evaporation. The gate metal layer may be made of Cu, Al, Ag, Mo, Cr, Nd, Ni, Mn, Ti, Ta or W, or an alloy thereof, and it may be of a single-layered structure, or a multiple-layered structure such as Cu/Mo, Ti/Cu/Ti or Mo/Al/Mo. A photoresist layer may be applied onto the gate metal layer and then exposed with a mask plate, so as to form a photoresist reserved region corresponding to a region where the pattern of the gate electrode of the Readout TFT is located, and a photoresist unreserved region corresponding to the other regions. Then, the photoresist layer is developed, so as to fully remove the photoresist at the photoresist unreserved region and enable a thickness of the photoresist at the photoresist reserved region to remain unchanged. Next, the gate metal layer at the photoresist unreserved region is fully etched off by an etching process, and the remaining photoresist is removed, so as to form the pattern of the gate electrode of the Readout TFT. The gate electrode may be connected to the gate line through a via-hole, and it is capable of shielding the active layer and preventing the active layer from being exposed to the ambient light beam.

Step b7: forming a pattern of a planarization layer on the base substrate.

To be specific, a resin layer made of photosensitive resin or non-photosensitive resin may be applied onto the base substrate and then exposed with a mask plate. Next, the resin layer is developed or etched by a dry-etching process, so as to form the pattern of the planarization layer including a via-hole.

Step b8: forming an anode on the base substrate.

To be specific, a conductive layer having a thickness of about 2000 to 6000 Å may be deposited onto the base substrate by magnetron-sputtering, thermal evaporation or any other film-forming methods. The conductive layer may be made of indium tin oxide (ITO), indium zinc oxide (IZO) or Ag, and it may be of a single-layered or multiple-layered structure. Specifically, the conductive layer may be of a triple-layered structure consisting of a layer made of ITO and having a thickness of 100 Å, a layer made of Ag and having a thickness of 1000 Å, and a layer made of ITO and having a thickness of 100 Å.

A photoresist layer may be applied onto the conductive layer and then exposed with a mask plate, so as to form a photoresist reserved region corresponding a region where the anode is located, and a photoresist unreserved region corresponding to the other regions. Next, the photoresist layer is developed, so as to fully remove the photoresist at the photoresist unreserved region and enable a thickness of the photoresist at the photoresist reserved region to remain unchanged. Then, the conductive layer at the photoresist unreserved region is fully etched off by an etching process, and the remaining photoresist is removed, so as to form the pattern of the anode. The anode is connected to the drain electrode of the pixel TFT through the via-hole in the planarization layer and the via-hole in the passivation layer.

Step b9: forming a pixel definition layer, an organic light-emitting layer and a cathode.

To be specific, a polyimide (PI) layer may be applied onto the base substrate and then exposed and developed so as to form the pixel definition layer. Then, the organic light-emitting layer is formed on the anode between the pixel definition layers, and it usually include a hole injection layer, a hole transmission layer, a light-emitting layer, a hole blocking layer, an electron blocking layer, an electron transmission layer and an electron injection layer. Next, the cathode is formed on the organic light-emitting layer, so as to form the final OLED display panel.

In this embodiment, the gate electrode of the Readout TFT is capable of shielding the active layer of the Readout TFT and preventing the active layer from being exposed to the ambient light beam. As a result, it is able to shield the active layer of the Readout TFT merely by the gate electrode of the Readout TFT itself, without any additional substrate provided with a black matrix.

Eighth Embodiment

The optical sensing unit in the sixth embodiment may also be applied to an oxide TFT touch panel. As shown in FIG. 1, the touch panel in this embodiment includes a pixel TFT, apart from the Readout TFT and the Photo TFT. To be specific, the method for manufacturing the oxide TFT touch panel includes the following steps.

Step c1: providing the base substrate, and forming patterns of the gate electrode of the pixel TFT, the gate electrode of the Photo TFT and the gate lines on the base substrate.

The base substrate may be a glass substrate or a quartz substrate. To be specific, a gate metal layer having a thickness of 2500 to 16000 Å may be deposited onto the base substrate by sputtering or thermal evaporation. The gate metal layer may be made of Cu, Al, Ag, Mo, Cr, Nd, Ni, Mn, Ti, Ta or W, or an alloy thereof, and it may be of a single-layered structure, or multiple-layered structure such as Cu/Mo, Ti/Cu/Ti and Mo/Al/Mo. A photoresist layer may be applied onto the gate metal layer, and then exposed with a mask plate, so as to form a photoresist reserved region corresponding to a region where the patterns of the gate lines, the gate electrode of the pixel TFT and the gate electrode of the Photo TFT are located, and a photoresist unreserved region corresponding to the other regions. Next, the photoresist is developed, so as to fully remove the photoresist at the photoresist unreserved region, and enable a thickness of the photoresist at the photoresist reserved region to remain unchanged. Then, the gate metal layer at the photoresist unreserved region is fully etched off by an etching process, and the remaining photoresist is removed, so as to form the patterns of the gate lines, the gate electrode of the pixel TFT and the gate electrode of the Photo TFT.

Step c2: forming the gate insulating layer, and the patterns of the active layer of the pixel TFT, the active layer of the Photo TFT and the active layer of the Readout TFT on the base substrate.

To be specific, the gate insulating layer having a thickness of about 2000 to 6000 Å may be deposited onto the base substrate 21 by PECVD. The gate insulating layer may be made of an oxide, a nitride or an oxynitride, and it may be of a single-layered, double-layered or multiple-layered structure. Specifically, the gate insulating layer may be made of SiNx, SiOx or Si(ON)x.

A transparent metal oxide layer having a thickness of about 20 to 1000 Å may be deposited onto the gate insulating layer by magnetron-sputtering, thermal evaporation or any other film-forming methods. The transparent metal oxide layer may be made of amorphous indium gallium zinc oxide (IGZO), hydrogen indium zinc oxide (HIZO), indium zinc oxide (InZnO), zinc oxide (ZnO), titanium dioxide (TiO2), tin oxide (SnO) or cadmium tin oxide (CdSnO), or any other metal oxide semiconductors. A photoresist may be applied onto the transparent metal oxide layer, and then exposed and developed. Next, the transparent metal oxide layer is etched and the photoresist is removed, so as to form the patterns of the active layer of the pixel TFT, the active layer of the Photo TFT and the active layer of the Readout TFT on the base substrate.

Step c3: forming a pattern of the etch stop layer on the base substrate.

To be specific, the etch stop layer having a thickness of 400 to 5000 Å may be deposited onto the base substrate by magnetron-sputtering, thermal evaporation, PECVD or any other film-forming methods, and it may be made of an oxide, a nitride or an oxynitride. Specifically, the etch stop layer may be made of SiNx, SiOx or Si(ON)x, and it may be of a single-layered structure, or a double-layered structure consisting of SiNx and SiOx. More specifically, the etch stop layer may be a layer made of SiNx and having a thickness of 3000 Å.

A photoresist layer may be applied onto the etch stop layer, and then exposed with a mask plate, so as to form a photoresist reserved region corresponding a region where the pattern of the etch stop layer is located, and a photoresist unreserved region corresponding to the other regions. Next, the photoresist layer is developed, so as to fully remove the photoresist at the photoresist unreserved region and enable a thickness of the photoresist at the photoresist reserved region to remain unchanged. Then, the etch stop layer at the photoresist unreserved region is fully etched off by an etching process, and the remaining photoresist is removed, so as to form the pattern of the etch stop layer including a via-hole.

Step c4: forming patterns of the source electrode and drain electrode of the pixel TFT, the source electrode and the drain electrode of the Readout TFT, the source electrode and the drain electrode of the Photo TFT, and data lines on the base substrate.

To be specific, a source/drain metal layer having a thickness of about 2000 to 6000 Å may be deposited onto the base substrate by magnetron-sputtering, thermal evaporation of any other film-forming methods. The source/drain metal layer may be made of Cu, Al, Ag, Mo, Cr, Nd, Ni, Mn, Ti, Ta or W, or an alloy thereof, and it may be of a single-layered structure, or a multiple-layered structure such as Cu/Mo, Ti/Cu/Ti or Mo/Al/Mo. Specifically, the source/drain metal layer may be a triple-layered structure consisting of a layer made of Ti and having a thickness of 500 Å, a layer made of Al and having a thickness of 2000 Å, and a layer made of Ti and having a thickness of 500 Å.

A photoresist layer may be applied onto the source/drain metal layer, and exposed with a mask plate, so as to form a photoresist reserved region corresponding to a region where the patterns of the source electrode and the drain electrode of the pixel TFT, the source electrode and the drain electrode of the Readout TFT, the source electrode and the drain electrode of the Photo TFT, and the data lines are located, and a photoresist unreserved region corresponding to the other regions. Next, the photoresist layer is developed, so as to fully remove the photoresist at the photoresist unreserved region and enable a thickness of the photoresist at the photoresist reserved region to remain unchanged. Then, the source/drain metal layer at the photoresist unreserved region is fully etched off by an etching process and the remaining photoresist is removed, so as to form the patterns of the source electrode and the drain electrode of the pixel TFT, the source electrode and the drain electrode of the Readout TFT, the source electrode and the drain electrode of the Photo TFT, and the data lines.

Step c5: forming a pattern of the passivation layer on the base substrate.

To be specific, the passivation layer having a thickness of 400 to 5000 Å may be deposited onto the base substrate by magnetron-sputtering, thermal evaporation, PECVD or any other film-forming methods. The passivation layer may be made of an oxide, a nitride or an oxynitride. Specifically, the passivation layer may be made of SiNx, SiOx or Si(ON)x, and it may be of a single-layered structure, or a double-layered structure consisting of layers made of SiNx and SiOx. More specifically, the passivation layer may be a layer made of SiNx and having a thickness of 3000 Å.

A photoresist layer may be applied onto the passivation layer and then exposed with a mask plate, so as to form a photoresist reserved region corresponding to a region where the pattern of the passivation layer is located, and a photoresist unreserved region corresponding to the other regions. Next, the photoresist layer is developed, so as to fully remove the photoresist at the photoresist unreserved region and enable a thickness of the photoresist at the photoresist reserved region to remain unchanged. Then, the passivation layer at the photoresist unreserved region is fully etched off by an etching method, and the remaining photoresist is removed, so as to form the pattern of the passivation layer including a via-hole.

Step c6: forming the gate electrode of the Readout TFT and a pixel electrode on the base substrate.

To be specific, a conductive layer having a thickness of about 20 to 1000 Å may be applied onto the base substrate by magnetron-sputtering, thermal evaporation or any other film-forming methods. The conductive layer may be a double-layered structure consisting layers made of Ti and ITO. A photoresist layer may be applied onto the conductive layer, and then exposed and developed. Next, the conductive layer is etched, and the photoresist is removed, so as to form the patterns of gate electrode of the Readout TFT and the pixel electrode. The pixel electrode is connected to the drain electrode of the pixel TFT through the via-hole in the passivation layer.

According to this embodiment, the gate electrode of the Readout TFT is capable of shielding the active layer of the Readout TFT and preventing the active layer from being exposed to the ambient light beam. As a result, it is able to shield the active layer of the Readout TFT merely by the gate electrode of the Readout TFT itself rather than any additional black matrix.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A method for manufacturing an optical sensing unit for an organic light-emitting diode (OLED) touch panel, the optical sensing unit comprising a Photo thin film transistor (TFT), a storage capacitor for storing a leakage current generated by the Photo TFT, and a Readout TFT for reading out an electric signal stored in the storage capacitor, the method comprising steps of:
    providing a substrate;
    forming a gate electrode of the Readout TFT capable of shielding an active layer of the Readout TFT and preventing the active layer from being exposed to an ambient light beam;
    forming a source electrode and a drain electrode of the Photo TFT in an insulating layer; and
    forming an entirety of a gate electrode of the Photo TFT in a gate insulating layer;
    wherein the gate insulating layer is between the insulating layer and the substrate;
    wherein an active layer of the Photo TFT includes an upper major surface and a lower major surface, and a pair of side surfaces that connect the upper major surface to the lower major surface;
    a first part of the source electrode of the Photo TFT and a first part of the drain electrode of the Photo TFT overlap and directly contact the upper major surface of the active layer of the Photo TFT; and
    a second part of the source electrode of the Photo TFT and a second part of the drain electrode of the Photo TFT are located on the gate insulating layer.

2. The method according to claim 1, further comprising:
    forming the active layer of the Photo TFT and the active layer of the Readout TFT by a single patterning process; and/or
    forming a source electrode and a drain electrode of the Readout TFT.

3. A method for manufacturing the OLED touch panel, comprising the method for manufacturing the optical sensing unit according to claim 1.

4. The method according to claim 3, wherein the method further comprising:
    forming the active layer of the Photo TFT and the active layer of the Readout TFT by a single patterning process; and/or
    forming a source electrode and a drain electrode of the Readout TFT.

5. The OLED touch panel manufactured by the method according to claim 3.

6. A display device comprising the OLED touch panel according to claim 5.

* * * * *